Dec. 6, 1966 H. ULLRICH 3,289,267

METHOD FOR PRODUCING A SEMICONDUCTOR WITH P-N JUNCTION

Filed Sept. 22, 1964

United States Patent Office 3,289,267

Patented Dec. 6, 1966

3,289,267
METHOD FOR PRODUCING A SEMICONDUCTOR WITH p–n JUNCTION

Hans Ullrich, Munich, Germany, assignor to Siemens & Halske Aktiengesellschaft, Berlin, Germany, a corporation of Germany Filed Sept. 22, 1964, Ser. No. 398,341
Claims priority, application Germany, Sept. 30, 1963, S 87,651
9 Claims. (Cl. 29—25.3)

In semiconductor crystal diodes and transistors, as well as other semiconductors with p-n junctions, the fact that the p-n junction must somehow extend up to the surface of the semiconductor crystal in order to contact zones of opposite conductance type, creates difficulties, since the slightest change in the surface characteristics at these points can influence the electrical characteristics of the semiconductor. This influence may be strong and uncontrollable.

It is an object of my invention to overcome these difficulties in the production of such semiconductors by employing measures which render the border regions of the p-n junction less sensitive to such disturbances.

My invention accomplishes such measures by carrying out the diffusion process, by which one of the p-n junctions of the device is produced in such a manner that the impurity atoms gradient, in the border region of the p-n junction is considerably less than the impurity gradient in the center part of the p-n junction.

Another object of my invention is to produce a semiconductor with at least one diffused p-n junction, wherein the active part of the p-n junction lies deep inside the semiconductor crystal and, at the same time, the border of the p-n junction is protected, as much as possible, against surface disturbances. A further object is to develop a particularly simple diffusion process capable of meeting the above requirements.

The invention relates to a method for the production of a semiconductor with p-n junction by fusing a gaseous dopant into semiconductor crystal predoped by a dopant of opposite conductance type, and wherein one part of the surface of the semiconductor crystal is covered with a protective coating against the penetration of the doping substance to be introduced by fusion. According to the invention, the diffusion taking place at two opposed surfaces of disc or plate like semiconductor crystal is conducted in such a way that the diffusion fronts, extending from the opposing surfaces, should contact each other along a closed line. A protective layer covers one of the two opposed surfaces except for one or more ring-shaped regions, which do not cross each other. A least one region of the base material, containing the original conductance type, remains below this protective coating. An electrode is alloyed to the region of the original base material.

According to my invention the penetration of the doping material being fused-in is regulated so that on the side where the diffusion is limited to a ring-shaped region, the penetration of the doping substances is retarded as compared to the opposite side of the semiconductor crystal. This is done primarily in order to achieve a considerably flatter impurity atoms profile, at the surface-touching border of the p-n junction, than in that part of the p-n junction lying within the interior of the semiconductor crystal.

The technique by which this is achieved is by polishing the semiconductor surface having the ring-shaped region, while the opposite semiconductor surface is being lapped. A layer of $SiO_2$ (preferably about 1 $\mu$m.) suffices as a masking means; this can be produced through oxidation of a silicon surface as known to the art.

The term "ring-shaped region" does not only denote a round, ring-shaped region, but also means a closed, angular region, for example triangular or square. This ring-shaped region can be produced, for example, by means of a mask which covers the semiconductor surface during the oxidation process.

In the drawings:

FIG. 2 is a transistor prepared by modifying the structure of

Figure 3:
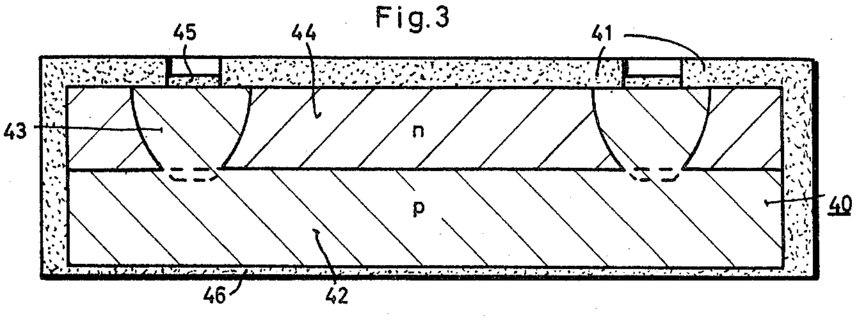

FIG. 3 which illustrates my invention.

A preferred non-limiting embodiment, for carrying out the invented method, is:

A $SiO_2$ layer is produced upon a thin silicon disc, about 100 $\mu$m. thick, which is polished on one and lapped on the other side. A ring- or frame-shaped surface is etched from the oxide layer of the polished side, by known photolithographic methods, using photo-dope, without causing the semiconductor surface, lying below, to lose its polished characteristic. At the same time, the oxide is removed from the opposite, lapped surface. Thereafter, the lapped surface and the ring- or frame-shaped region of the polished side is being treated in a pre-diffusion process with a gaseous doping material which creates a conductance type opposing the base crystal. Because of the difference in the surface characteristic between the polished and the lapped surface, a larger amount of atoms of the doping material penetrates the lapped surface, per surface unit, than the opposite polished surface. During an ensuing post-diffusion process, the p-n junctions thus produced are driven into the depth from both sides. Due to the larger, instantaneous surface source on the lapped surface, the diffusion front moves faster from here than from the polished surface. Accordingly, the concentration gradients at the moment of the meeting of the diffusion fronts will vary since the diffusion front emerging from the lapped surface will show a steeper concentration gradient. An island of the initial original material remains below the oxide coating, inside the ring- or frame-shaped region, on the polished surface of the semiconductor crystal.

The above condition is illustrated in FIG. 3. The silicon crystal 40 was coated, through an oxidizing process, with a $SiO_2$ layer 41. The original conductance type of the crystal is n-conductance, in the example. By means of photolithography, a ring-shaped window 45 is etched into the $SiO_2$ layer 41 and the oxide layer removed from the opposed surface. Due to the above-described diffusion and post-diffusion, a p-conductive ring-shaped region 43, emerging from the window 45, was formed, which was so deeply fused in, that it touches or even overlaps the p-conductive region which was fused-in simultaneously from the opposing surface. Here the diffusion is carried out only far enough for a n-conductive region 44 to remain under the remaining part 41. The desired p-n junction is the border between the n-conductive region 44 and the p-conductive region, which is formed out of the two connecting parts 43 and 42. It is also possible through a special development of the diffusion process to produce an oxide layer which again covers those parts of the semiconductor surface which were previously exposed, i.e. the window 45 and the opposite semiconductor surface 46.

Of course, it is possible to produce, on a single semiconductor plate, many structures of the type illustrated in FIG. 3. For this purpose, a large silicon disc of, for example, n-conductance is lapped on one side and polished on the other. Thereafter, the silicon disc is oxidized to give a thin oxide layer, of approximately 1 $\mu$m., which is thin enough so that, after its complete removal, the difference between the lapped and the polished surface is maintained relative to the penetrating capacity of the doping material coming from the gaseous phase.

The oxide layer is completely removed on the lapped surface. On the opposite surface, it is removed only in individual, ring-shaped regions which neither cross nor overlap. The diffusion process is conducted in the above-described manner. The doping materials when using, for example silicon, correspond to the doping materials used in the silicon-planar technique. For the production of p-conductive regions in an n-conductive base material, diffusion is carried out, for example, by a $B_2O_3$ vapor, and for the production of an n-conductive region in a p-conductive base material diffusion is carried out for example by phosphorus-trioxide and/or phosphorus-pentoxide vapor. It is different in the case of germanium or $A^{III}B^{V}$-semiconductors. The above-mentioned doping materials are also applicable for germanium; however, indium, zinc or gallium vapor is preferred for producing p-type conductance and antimony or arsenic vapor for producing n-type conductance.

Figure 1:
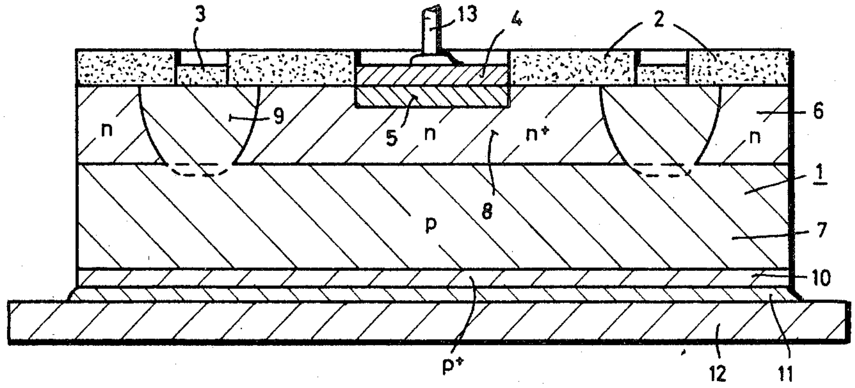
FIG. 1 is a diode.
Figure 2:
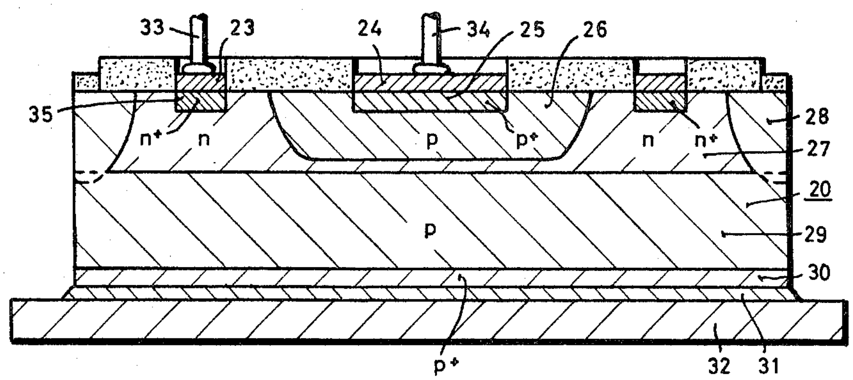

In order to further develop the structure, illustrated in FIG. 3 into a diode, for example, according to FIG. 1, or to a transistor, for example, according to FIG. 2, only a few additional steps are required.

The semiconductor base crystal 1 comprising n-type silicon was oxidized while using a mask, to create $SiO_2$ layer, in which a ring-shaped window 3 is present, on the base crystal. By diffusion with a doping material creating a p-conductance, a connecting p-type region was created. This p-type region consists of ring-region 9 and region 7, which was produced by the diffusion from the opposite side, and together with region 8 comprising the unaffected n-conductive base material forms the required p-n junction. In order to reach the diode of FIG. 1 from the structure of FIG. 3, the oxide layer covering the n-conductive region 8, is removed in one locality and an unbiased contact is created. The latter is produced, for example by alloying an n-conductance producing alloying metal 4 so that, upon recrystallization, a strong n-conductance recrystallization region 5 is created. The contacting results through an ohmic contact 13, which is connected with the alloying metal 4, for example, by thermocompression or by means of soldering.

For contacting the p-region, a preferably large area alloying contact is produced on the originally lapped surface of the semiconductor crystal, a thin layer of p-conductive alloying metal is arranged between a base plate 12 and the semiconductor crystal. This is then heated to alloying temperature to form a thin layer of alloying metal 11 between the base plate 12 and the p-conductive region 7 while producing a strong p-conductance region 10 in the semiconductor material.

If gas diffusion is carried out using boron trioxide to produce p-conductance and $P_2O_5$ to produce n-conductance, the following mode of operation may be employed:

The silicon is covered with a doping material and the same is driven to the final depth during an ensuing post-diffusion process. During the post-diffusion process, it is advantageous to oxidize the silicon-surface with an oxidizing agent such as oxygen. A thin oxide layer is thereby formed during diffusion on the exposed localities, for example at the window 3. The structure of FIG. 1 is cut out of a large semiconductor plate upon which a large number of adjoining structures were produced as described with respect to FIG. 3. For this reason, the lateral surface of the device of FIG. 1 (contrary to FIG. 3) is not coated with an oxide layer. As can be recognized from the figures the even course of the diffusion front is a result of the even contact areas of the semiconductor plates, upon which diffusion from the gaseous phase is carried out.

The transistor depicted in FIG. 2 can also be derived from the structure of FIG. 3.

A p-n structure is produced by using a mask, for example an oxide masking on the monocrystalline semiconductor base material 20 comprising, for example n-type conductance silicon. This structure is formed, on one hand by an n-region comprising the base material of the semiconductor and corresponding to region 8 in FIG. 1 and 44 in FIG. 3 and of a p-region formed by the diffusion. This p-region was created as above by being diffused from opposite siles. The p— zone 29 is produced from the lapped surface of the semiconductor surface and the p— zone 28 from the ring-shaped areas of the opposing, polished surface of the semiconductor crystal. The oxide layer on the polished surface of the semiconductor crystal was removed at two localities after the diffusion was completed. This makes possible contacting the n-conductive region 27 and producing an emitter region in the n-conductive zone, which is used as a base region. In producing emitter zone 26, it is necessary, that a part of the n-conductive zone 27 remain between the area 26 and the p-conductive areas 29 or 28. In order to obtain the structure depicted in FIG. 2, in two successive coating processes which may possibly be separated by a renewed oxidation of the silicon surface and a photolithographic process, a window is created in the center of the oxide surface 41. High surface concentration of the doping material (e.g. $B_2O_3$) are produced above the areas 26 and 28. Therefore, during the common post-diffusion process a thin n-region remains between zone 26 and zone 28. The contacting of p— type zone 26 takes place by alloying a p-type producing metal 24 which initiates a p+ region 25. The contacting of the emitter-electrode 24 takes place, finally, through a terminal 34. Zone 29 of the semiconductor crystal is used as a collector. The contacting of this zone is carried out in a similar manner to zone 7 in FIG. 1. Zone 29, the originally lapped surface of the semiconductor crystal, is soldered or alloyed to a base plate 32 by a thin layer of a soldering metal 31, producing p-conductance. This alloying leads to the formation of a p+ zone 30 in the lower area of the p— zone 29. To contact the base zone 27 a window for example ring-shaped, is provided into which a base electrode 23 was alloyed by means of an n-producing alloying metal. This electrode 23 results in the formation of an equally ring-shaped and n+ zone 35. The electrical contact of the base electrode 23 took place through the ohmic contact 33. The device shown in FIG. 2, which was produced simultaneously with several transistors of the same type, from a single silicon plate, was cut thereafter into individual systems.

To assure production of the structure of the invention, the following are necessary:

(1) A different surface treatment of the two opposite surfaces of the silicon plate (one side being lapped, the other being polished);

(2) The width of the ring- or frame-shaped area of the side of the semiconductor plate, possessing the weaker depth of penetration for the doping material in the oxide masking, should be less than one fourth of the total thickness of the semiconductor plate;

(3) The diffusion be carried out in two steps;

(a) a coating process, in which the doping material is first partially diffused into the semiconductor crystal only a little (b) and a deeper doping process, continuing until the two diffusion fronts, extending from opposite sides of the semiconductor plate, contact each other, to form a connecting p-conductance area.

I claim:

1. The method of producing a semiconductor with p-n junction by diffusing, into a flat simoconductor crystal of one conductance type, a gaseous doping agent of opposite conductance type, which comprises lapping one of the two flat surfaces and polishing the other of the two flat surfaces covering a portion of the surface of the semiconductor crystal with a protective coating preventing the penetration of doping material, providing a ring-shaped window in protective coating on the polished side of the semiconductor crystal, diffusing the gaseous doping agent from opposite sides into the semiconductor crystal to produce diffusion fronts within the semiconductor crystal along a closed line while permitting a region of the original conductance type to remain under the protective coating, and attaching an electrode to this region of original conductance type.

2. The method of claim 1, wherein the semiconductor crystal is disc-shaped silicon crystal, the coating is a $SiO_2$ coating, and the ring-shaped window is etched on the surface possessing the lower penetrating capacity, without equating the specific absorptive capacity of the two opposed surfaces.

3. The method of claim 2, wherein the $SiO_2$ coating is completely removed at the opposite surfaces, without noticeably touching the semiconductor material lying below.

4. The method of claim 3 wherein the gaseous doping material is first diffused into the exposed surfaces only to a point where the diffusion fronts forming from two opposed surfaces, toward the inside of the semiconductor crystal, do not quite meet and subsequently diffusing the diffusion fronts into each other, after curbing the supply of doping material supply particularly by a $SiO_2$ layer.

5. The method of claim 4, wherein $B_2O_3$ vapor is diffused in when using an n-conductance base material.

6. The method of claim 5, wherein the width of the ring-shaped area, etched into the oxide layer is less than a quarter of the distance to the opposed surface.

7. The method of claim 6, wherein the $SiO_2$ layer which covers the base material not subjected to diffusion is removed, at least in spots, for the purpose of contacting the region lying below.

8. The method of claim 4, wherein phosphorus is diffused in when using a p-conductance base material.

9. The method of producing a semiconductor component with a p-n junction, by indiffusing a gaseous dopant of one conductance type into a semiconductor crystal which is pre-doped with a dopant of opposite type, wherein a portion of the surface of the semiconductor crystal is coated with a protective layer whereby a local indiffusion of the doping substance into the semiconductor is prevented, said indiffusion of the gaseous dopant is effected at opposite parallel planes of a disc-shaped semiconductor crystal; a ring-shaped region at one plane and the entire semiconductor surface of the plane opposite the ring-shaped region are subjected to the action of the gaseous dopant material, the dopant is indiffused into the ring-shaped, exposed region of the semiconductor surface with a smaller concentration than at the opposite plane; prior to the close of the diffusion process, the diffusion fronts, issuing from the two opposite planes, meet enclosing a region of the original doping type by the combined diffusion fronts and bordering the semiconductor surface and finally this region, as well as the semiconductor region, altered by diffusion with respect to the conductivity type, are provided with electrodes.

References Cited by the Examiner

UNITED STATES PATENTS

| | | | |
|---|---|---|---|
| 2,569,347 | 9/1941 | Shockley | 148—33.5 X |
| 2,937,114 | 5/1960 | Shockley | 148—33.5 X |
| 2,944,321 | 7/1960 | Westberg | 148—33.5 X |
| 2,947,923 | 8/1960 | Pardue | 148—189 X |
| 2,967,793 | 9/1961 | Philips | 148—33.5 |
| 3,064,167 | 11/1962 | Hoerni | 148—189 X |
| 3,165,430 | 1/1965 | Hugle | 148—189 X |
| 3,180,766 | 4/1965 | Williams | 148—33.5 X |

HYLAND BIZOT, *Primary Examiner.*

DAVID L. RECK, *Examiner.*